(12) United States Patent
Matsuda (10) Patent No.: US 11,316,081 B2
(45) Date of Patent: Apr. 26, 2022

(54) LIGHT-EMITTING MODULE AND METHOD FOR MANUFACTURING SAME

(71) Applicant: NICHIA CORPORATION, Anan (JP)

(72) Inventor: Yoshikazu Matsuda, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/006,760

(22) Filed: Aug. 28, 2020

(65) Prior Publication Data

US 2021/0066553 A1 Mar. 4, 2021

(30) Foreign Application Priority Data

Aug. 30, 2019 (JP) .............................. JP2019-158717

(51) Int. Cl.
*H01L 33/50* (2010.01)
*H01L 33/62* (2010.01)

(52) U.S. Cl.
CPC .......... *H01L 33/505* (2013.01); *H01L 33/507* (2013.01); *H01L 33/62* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 8,044,415 B2* | 10/2011 | Messere | ............ | B32B 17/10541 257/88 |
| 9,799,811 B2* | 10/2017 | Maki | ....................... | H01L 33/08 |
| 10,492,300 B2* | 11/2019 | Maki | ....................... | F21V 19/00 |
| 2004/0227256 A1 | 11/2004 | Seko | | |
| 2005/0093172 A1 | 5/2005 | Tsukahara et al. | | |
| 2006/0163743 A1 | 7/2006 | Kuwabara et al. | | |
| 2011/0272800 A1 | 11/2011 | Chino | | |
| 2012/0153509 A1 | 6/2012 | Kyozuka et al. | | |
| 2016/0013376 A1 | 1/2016 | Maki | | |
| 2017/0365534 A1 | 12/2017 | Machida et al. | | |
| 2018/0040786 A1 | 2/2018 | Chen | | |
| 2018/0239193 A1 | 8/2018 | Hayashi | | |
| 2019/0049649 A1 | 2/2019 | Hayashi et al. | | |

(Continued)

FOREIGN PATENT DOCUMENTS

| | | |
|---|---|---|
| JP | 2001015650 A | 1/2001 |
| JP | 2002050721 A | 2/2002 |

(Continued)

*Primary Examiner* — Bo B Jang
(74) *Attorney, Agent, or Firm* — Hunton Andrews Kurth LLP (57) ABSTRACT

A light-emitting module includes an optical member including a first major surface, and a second major surface; a light-emitting device bonded to the first major surface, the light-emitting device including a light-emitting element including a major light-emitting surface, an electrode surface, and an electrode disposed at the electrode surface, a resin member covering a side surface of the light-emitting element, and a conductive layer disposed continuously on the electrode and on the resin member; an insulating member covering the first major surface of the optical member, a side surface of the light-emitting device, and a portion of the conductive layer of the light-emitting device; and a wiring member disposed on the insulating member and electrically connected to the conductive layer.

20 Claims, 11 Drawing Sheets

(56) References Cited

U.S. PATENT DOCUMENTS

2019/0294004 A1  9/2019  Hashimoto
2019/0294005 A1  9/2019  Imada et al.

FOREIGN PATENT DOCUMENTS

| | | |
|---|---|---|
| JP | 2004342903 A | 12/2004 |
| JP | 2005111928 A | 4/2005 |
| JP | 2006229212 A | 8/2006 |
| JP | 2007019096 A | 1/2007 |
| JP | 2010062592 A | 3/2010 |
| JP | 2011238767 A | 11/2011 |
| JP | 2012129419 A | 7/2012 |
| JP | 2012138454 A | 7/2012 |
| JP | 2016037546 A | 3/2016 |
| JP | 2017168807 A | 9/2017 |
| JP | 2017224787 A | 12/2017 |
| JP | 2018056552 A | 4/2018 |
| JP | 2018133304 A | 8/2018 |
| JP | 2019012681 A | 1/2019 |
| JP | 2019071471 A | 5/2019 |
| JP | 2019175846 A | 10/2019 |
| JP | 2019175847 A | 10/2019 |
| WO | 2006098545 A2 | 9/2006 |

\* cited by examiner

LIGHT-EMITTING MODULE AND METHOD FOR MANUFACTURING SAME

CROSS-REFERENCE TO RELATED APPLICATION

This application claims priority to Japanese Patent Application No. 2019-158717, filed on Aug. 30, 2019, the disclosure of which is hereby incorporated by reference in its entirety.

BACKGROUND

Embodiments of the present disclosure relate to a light-emitting module and a method for manufacturing the same.

There is a light-emitting module that includes multiple light-emitting devices. A smaller light-emitting module is desirable.

SUMMARY

An embodiment of the present disclosure provides a smaller light-emitting module and a method for manufacturing the light-emitting module.

In an embodiment of the present disclosure, a light-emitting module includes an optical member including a first major surface, and a second major surface opposite to the first major surface; a light-emitting device bonded to the first major surface, the light-emitting device including a light-emitting element including a major light-emitting surface, an electrode surface opposite to the major light-emitting surface, and an electrode disposed at the electrode surface, a resin member covering a side surface of the light-emitting element, and a conductive layer disposed continuously on the electrode and on the resin member; an insulating member covering the first major surface of the optical member, a side surface of the light-emitting device, and a portion of the conductive layer of the light-emitting device; and a wiring member disposed on the insulating member and electrically connected to the conductive layer.

In another embodiment of the present disclosure, a method for manufacturing a light-emitting module includes preparing a structure body including an optical member including a first major surface, and a second major surface opposite to the first major surface, a light-emitting device bonded to the first major surface, the light-emitting device including: a light-emitting element including a major light-emitting surface, an electrode surface opposite to the major light-emitting surface, and an electrode disposed at the electrode surface; a resin member covering a side surface of the light-emitting element; and a conductive layer disposed continuously on the electrode and on the resin member, and an insulating member covering the first major surface of the optical member, a side surface of the light-emitting device, and the conductive layer; forming a hole reaching the conductive layer by irradiating laser light on the insulating member; and forming a wiring member in the hole and at an upper surface of the insulating member, the wiring member being connected to the conductive layer.

According to an embodiment of the present disclosure, a smaller light-emitting module and a method for manufacturing the light-emitting module are provided.

DETAILED DESCRIPTION OF EMBODIMENTS

Various embodiments are described below with reference to the accompanying drawings.

The drawings are schematic and conceptual; and the relationships between the thickness and width of portions, the proportions of sizes among portions, etc., are not necessarily the same as the actual values. The lengths and/or the proportions may be illustrated differently between the drawings, even for identical portions. In this specification, components similar to those described previously or illustrated in an antecedent drawing are marked with the same reference numerals, and a detailed description is omitted as appropriate.

In the description hereinbelow, terms that indicate designated directions and/or positions (e.g., "up", "down", and other terms including such terms) are used as necessary; however, the use of such terms is for better understanding of the invention when referring to the drawings, and the technical scope of the invention is not limited by the meaning of such terms. Unless specified otherwise in the disclosure, "orthogonal" includes the case where two straight lines, sides, surfaces, etc., are in a range of about ±5 degrees from 90 degrees. The lengths, sizes, etc., being the "same" or "equal" includes the case where the values are in a range of about ±10% unless specified otherwise.

First Embodiment

Figure 1:
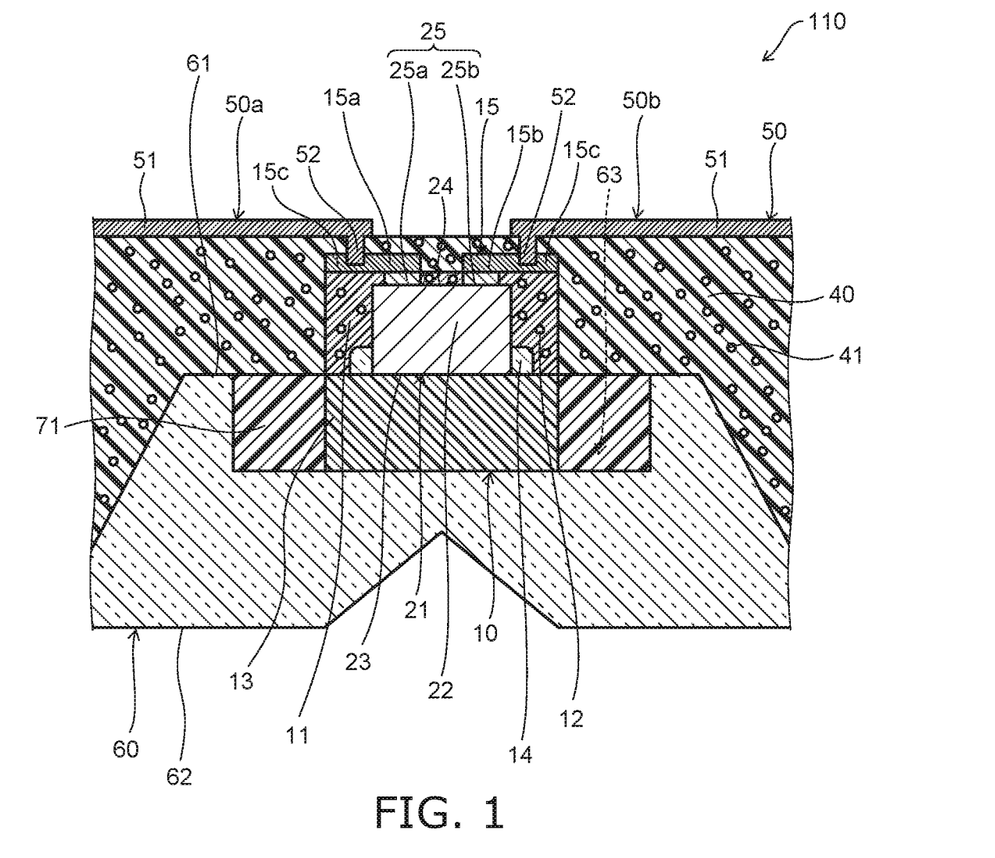
FIG. 1 is a schematic cross-sectional view illustrating a light-emitting module according to a first embodiment of the present disclosure.
Figure 2:
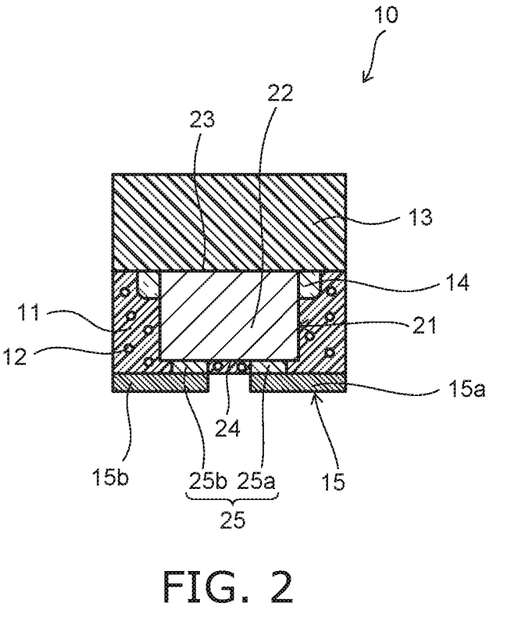
FIG. 2 is a schematic cross-sectional view illustrating a light-emitting device of the light-emitting module according to the first embodiment of the present disclosure.

FIG. 1 is a schematic cross-sectional view illustrating a light-emitting module 110 according to a first embodiment.

As shown in FIG. 1, the light-emitting module 110 according to the first embodiment includes a light-emitting device 10, an insulating member 40, a wiring member 50 (50a and 50b), and an optical member 60.

Light-Emitting Device

The light-emitting device 10 which is a light source of the light-emitting module 110 includes a light-emitting element 21, a resin member 11, and a conductive layer 15 (15a and 15b).

The light-emitting element 21 includes a semiconductor stacked body 22 and an electrode 25. The electrode 25 includes a pair of electrodes 25a and 25b. The light-emitting element 21 also includes a major light-emitting surface 23, and an electrode surface 24 positioned at the side opposite to the major light-emitting surface 23, and the electrodes 25a and 25b are disposed at the electrode surface 24. In the example shown in FIG. 1, the lower surface of the light-emitting element 21 is the major light-emitting surface 23, and the upper surface of the light-emitting element 21 is the electrode surface 24.

The light-emitting element 21 is, for example, an LED (light-emitting diode). The semiconductor stacked body 22 of the light-emitting element 21 includes a light-emitting layer. The semiconductor stacked body 22 emits light of any wavelength, e.g., blue and green light. For example, the semiconductor stacked body 22 may include a nitride semiconductor ($In_xAl_yGa_{1-x-y}N$ in which $0 \le x$, $0 \le y$, and $x+y \le 1$).

When a voltage is applied between the pair of electrodes 25a and 25b, a current flows in the semiconductor stacked body 22, and light is emitted from the light-emitting element 21. One of the electrode 25a or the electrode 25b is an anode electrode (or a p-side electrode), and the other is a cathode electrode (or an n-side electrode).

The resin member 11 covers the side surface of the light-emitting element 21 and the electrode surface 24 of the light-emitting element 21. The resin member 11 is provided between the electrode 25a and the electrode 25b and covers the side surfaces of the electrodes 25a and 25b.

The resin member 11 may be light-transmissive or light-reflective. When transmissive, a material similar to a transparent member 13 described below may be used. In such a case, the resin member 11 and the transparent member 13 may be formed to have a continuous body. When the resin member 11 is light-reflective, for example, the resin member 11 may include an insulative base material and multiple light-reflective particles 12. For example, a silicone resin, an epoxy resin, an acrylic resin, a urethane resin, etc., are examples of the base material. The particle 12 includes, for example, at least one selected from the group consisting of aluminum oxide, titanium oxide, zirconium oxide, zinc oxide, and silicon oxide. In one example, the average particle size of the particle 12 is not less than 0.1 µm and not more than 10 µm.

The conductive layer 15a is disposed continuously on the electrode 25a and on the resin member 11 and is electrically connected to the electrode 25a. The conductive layer 15b is disposed continuously on the electrode 25b and on the resin member 11 and is electrically connected to the electrode 25b. The conductive layer 15a and the conductive layer 15b are insulatively isolated from each other. For example, metal materials such as copper (Cu), gold (Au), silver (Ag), titanium (Ti), nickel (Ni), tin (Sn), etc., are examples of the material of the conductive layer 15. To form the conductive layer 15, a formation method such as printing or spraying a conductive paste including the metal material described above, a film formation method in which the metal material is sputtered, etc., may be used.

The conductive layer 15a includes a portion positioned on the electrode 25a of the light-emitting element 21 in contact with the electrode 25a, a portion connected above the electrode surface 24 of the light-emitting element 21, and a portion provided at the upper surface of the resin member 11 at a region outward (the cross section of FIG. 1, leftward) of the side surface of the light-emitting element 21. The conductive layer 15b includes a portion positioned on the electrode 25b of the light-emitting element 21 in contact with the electrode 25b, a portion connected to the electrode 25b above the electrode surface 24 of the light-emitting element 21, and a portion provided at the upper surface of the resin member 11 at a region outward (the cross section of FIG. 1, rightward) of the side surface of the light-emitting element 21.

The light-emitting device 10 may include the transparent member 13. The transparent member 13 is disposed at the major light-emitting surface 23 side. Also, instead of being a portion of the light-emitting device 10, the transparent member 13 may be prepared as a separate member.

For example, the light-emitting element 21 is bonded to the transparent member 13 by a light-transmissive resin 14. It is preferable for the transparent member 13 to be capable of transmitting 50% or more of the light from the light-emitting element 21. The transparent member 13 can have a single-layer structure made of a single layer, or a stacked structure. The transparent member 13 may include a fluorescer that absorbs the light from the light-emitting element 21 and converts the light into a different wavelength. In such a case, the transparent member 13 may have a stacked structure that includes a wavelength conversion layer including a fluorescer, and a transparent layer substantially not including a fluorescer. The wavelength conversion layer may be a single layer or stacked layers. Known fluorescers of relevant fields such as an yttrium-aluminum-garnet-based fluorescer (a YAG-based fluorescer), a nitride-based fluorescer, an oxynitride fluorescer, a $K_2SiF_6$:Mn-based fluorescer (a KSF fluorescer), a sulfide-based fluorescer, etc., can be used as appropriate. For example, $CaAlSiN_3$:Eu, (Sr, Ca)$AlSiN_3$:Eu, (Sr, Ca)$_2Si_5N_8$:Eu, and (Sr, Ca)$Si_7N_{10}$:Eu are examples of nitride-based fluorescers. Also, light-emitting substances such as so-called nanocrystals or quantum dots may be used as the fluorescer. If the transparent member 13 includes a fluorescer, the light-emitting device 10 can emit white light.

Optical Member

The optical member 60 is, for example, a member for causing the light entering from the light-emitting device 10 to spread in a planar configuration. For example, the optical member 60 also can function as a lens or the like. The optical member 60 may be a plate-shaped member and may include a first major surface 61, and a second major surface 62 to the first major surface 61. The light-emitting device 10 is bonded to the first major surface 61 side. The second major surface 62 is used as the light extraction surface of the light-emitting module 110. One or multiple light-emitting devices 10 may be bonded to one optical member 60.

The first major surface 61 of the optical member 60 may be a flat surface or may include a recess 63 in which the light-emitting device 10 is disposed as shown in FIG. 1. In such a case, the major light-emitting surface 23 side of the light-emitting device 10 is disposed to face the bottom surface of the recess 63. A resin member 71 that is used as a bonding agent may be predisposed at the bottom surface of the recess 63.

When the light-emitting device 10 includes the transparent member 13, the transparent member 13 and the bottom surface of the recess 63 face each other. When the transparent member 13 is provided separately from the light-emitting device 10, the transparent member 13 may be predisposed inside the recess 63, and the light-emitting device 10 may be disposed on the transparent member 13.

Insulating Member

The insulating member 40 is provided at the first major surface 61 side of the optical member 60. The insulating member 40 covers the first major surface 61 of the optical member 60 and the side surface of the light-emitting device 10. The insulating member 40 covers portions of the conductive layers 15a and 15b. The insulating member 40 may be provided between the conductive layer 15a and the conductive layer 15b.

The insulating member 40 is, for example, a white resin. The insulating member 40 is, for example, a light-reflective resin. The insulating member 40 includes a base material and multiple light-reflective particles 41. The base material of the insulating member 40 includes, for example, at least one selected from the group consisting of a silicone resin, an epoxy resin, an acrylic resin, and a urethane resin, etc. It is preferable for the base material of the insulating member 40 to include a silicone resin. Thereby, for example, good patternability is obtained, and a high hardness after curing is obtained. The particle 41 includes, for example, at least one selected from the group consisting of aluminum oxide, titanium oxide, zirconium oxide, zinc oxide, and silicon oxide. The particle 41 may include a glass filler.

For example, the refractive index of the particle 41 is greater than the refractive index of the base material of the insulating member 40. For example, it is more preferable for the average particle size of the multiple particles 41 to be not less than 0.1 µm and not more than 10 µm. A highly efficient light-scattering effect is easily obtained thereby. For example, the concentration of the multiple particles 41 in the insulating member 40 may be not less than 10 weight % and not more than 60 weight %. It is more preferable for the concentration of the multiple particles 41 in the insulating member 40 to be not less than 20 weight % and not more than 50 weight %. Good moldability and high light reflectance may be obtained thereby.

The wiring members 50a and 50b are disposed on the insulating member 40. The wiring member 50a and the wiring member 50b are insulatively isolated from each other. The wiring member 50a includes a connection portion 52 connected to the conductive layer 15a, and a wiring portion 51 provided at the upper surface of the insulating member 40 and connected to the connection portion 52. The wiring member 50b includes the connection portion 52 connected to the conductive layer 15b, and the wiring portion 51 provided at the upper surface of the insulating member 40 and connected to the connection portion 52.

The wiring portion 51 and the connection portion 52 may be formed from the same conductive material to have a continuous body. For example, metal materials such as copper (Cu), gold (Au), silver (Ag), titanium (Ti), nickel (Ni), and tin (Sn) may be used as the material of the wiring members 50a and 50b. To form these conductive layers, a formation method such as printing or spraying a conductive paste including the metal material described above, a film formation method using sputtering, etc., may be used. For example, the film thickness of the wiring portion 51 may be not less than 0.1 µm and not more than 100 µm.

The conductive layers 15a and 15b to which the wiring members 50a and 50b are connected may extend from the electrodes 25a and 25b within the electrode surface 24 of the light-emitting element 21 to regions outward of the side surface of the light-emitting element 21. Thus, because the surface areas of the conductive layers 15a and 15b are greater than those of the electrodes 25a and 25b of the light-emitting element 21, the conductive layers 15a and 15b and the wiring members 50a and 50b may be connected at positions distant to the other electrodes. For example, the connection portions 52 of the wiring members 50a and 50b may be connected to the conductive layers 15a and 15b at regions on the resin member 11 covering the side surface of the light-emitting element 21. Thereby, even when the distance between the electrodes 25a and 25b of the light-emitting element 21 is short, short-circuits between the wiring members 50a and 50b due to the distance between the wiring member 50a and the wiring member 50b being too short can be avoided.

The electrical connections between the conductive layers 15a and 15b and the wiring members 50a and 50b may be located above the resin member 11 instead above the light-emitting element 21. For example, in the example shown in FIG. 1, the connection portions 52 of the wiring members 50a and 50b do not overlap the electrode surface 24 of the light-emitting element 21. Thereby, the degrees of freedom are increased for the electrical connection structure between the conductive layers 15a and 15b and the wiring members 50a and 50b. For example, the tolerance range of the manufacturing conditions of the connection portion 52 is increased, the manufacturing is easier, and the conductive layers 15a and 15b and the wiring members 50a and 50b can be electrically connected more stably. The entire connection portion 52 may be disposed at a position not overlapping the electrode surface 24 of the light-emitting element 21 as described above, or a portion of the connection portion 52 may overlap the electrode surface 24. When a portion of the connection portion 52 overlaps the electrode surface 24, the heat from the light-emitting element 21 can be efficiently emitted externally. Furthermore, a portion of the connection portion 52 may overlap the electrode 25. When the connection portion 52 overlaps the electrode surface 24, it is preferable to form the connection portion 52 to a depth such that the connection portion 52 and the electrode surface 24 do not contact. To this end, the connection portion 52 is formed to be thinner than the conductive layer 15. When the connection portion 52 overlaps the electrode surface 24 and/or the conductive layer 15, the connection portion 52 may contact only the conductive layer 15 or may contact both the conductive layer 15 and the electrode.

The connection portions 52 of the wiring members 50a and 50b may also be connected to portions 15c of the conductive layers 15a and 15b provided between the resin member 11 and the insulating member 40. For example, by disposing materials having similar linear expansion coefficients above and below the portions of the connection portions 52 connected to the conductive layers 15a and 15b, the stress can be easily relaxed even when stress is generated by heat of the connection portions 52, etc.; and damage of the connection portions 52 can be suppressed. Stable connections between the conductive layers 15a and 15b and the wiring members 50a and 50b are easily maintained thereby.

According to the embodiment, stable electrical connections are easily obtained even when the size of the light-emitting element 21 is reduced and the distance between the electrode 25a and the electrode 25b is reduced. According to the embodiment, a smaller light-emitting module can be provided.

As described below, the connection portions 52 of the wiring members 50a and 50b may be formed by forming holes in the insulating member 40 to reach the conductive layers 15a and 15b by irradiating laser light on the insulating member 40, and by filling a conductive material into the holes. In the embodiment, a smaller light-emitting module can be manufactured with high productivity.

When forming the holes in the insulating member 40 by using laser light, the bottoms of the holes can be positioned inside the conductive layers 15a and 15b. In other words, recesses are formed in the conductive layers 15a and 15b. By filling the conductive material into the recesses of the conductive layers 15a and 15b, for example, the connection portions 52 of the wiring members 50a and 50b contact the bottom surfaces and side surfaces of the recesses of the conductive layers 15a and 15b as shown in FIG. 1. For the same diameters of the connection portions 52, such a structure can reduce the contact resistance because the contact areas between the connection portions 52 and the conductive layers 15 are greater than when the connection portions 52 contact only the upper surfaces of the conductive layers 15a and 15b.

Figure 3:
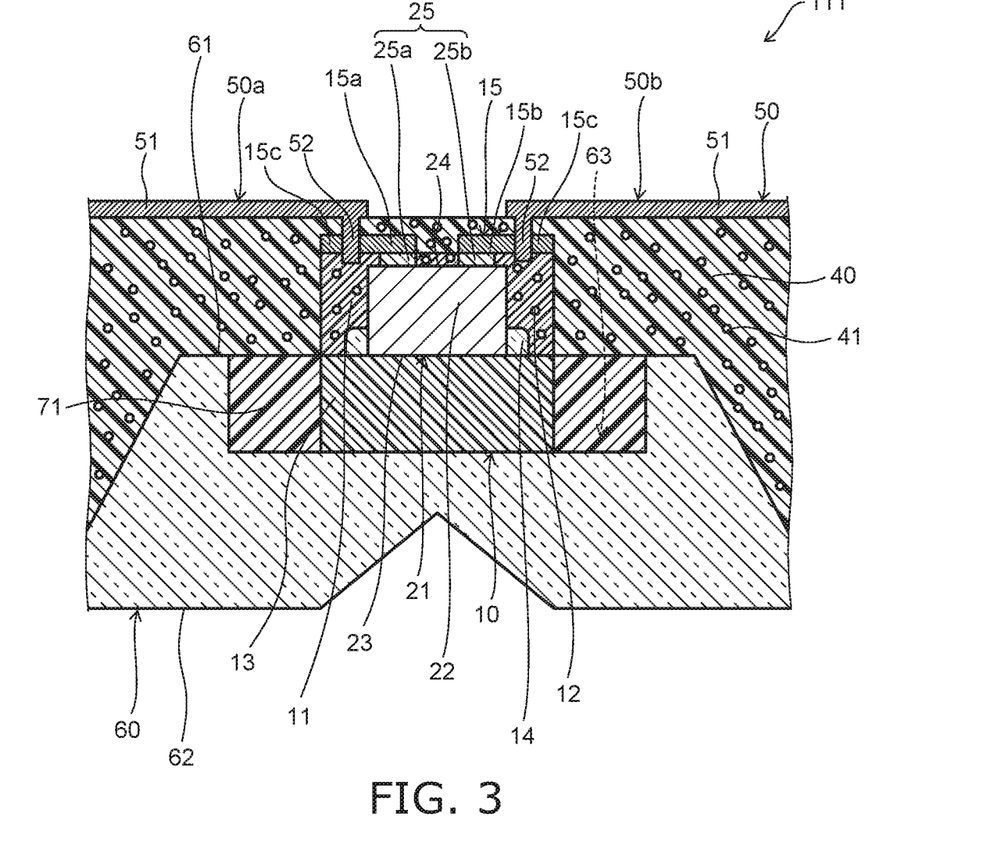
FIGS. 3 to 7 are schematic cross-sectional views illustrating a light-emitting module according to the first embodiment of the present disclosure.
Figure 4:
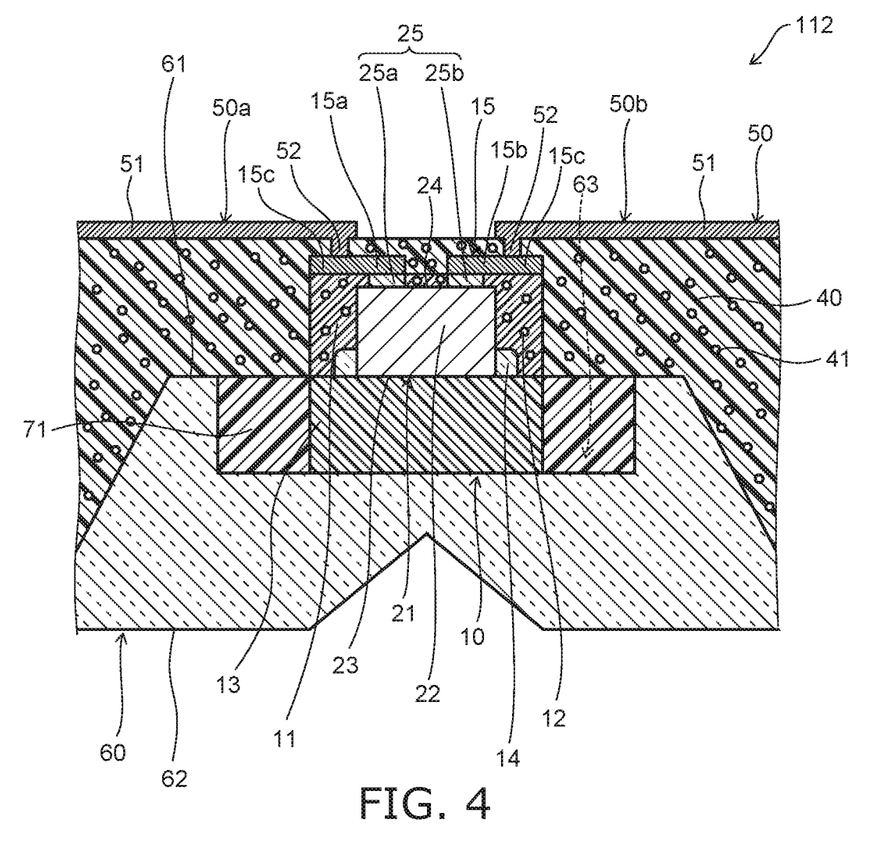
Figure 5:
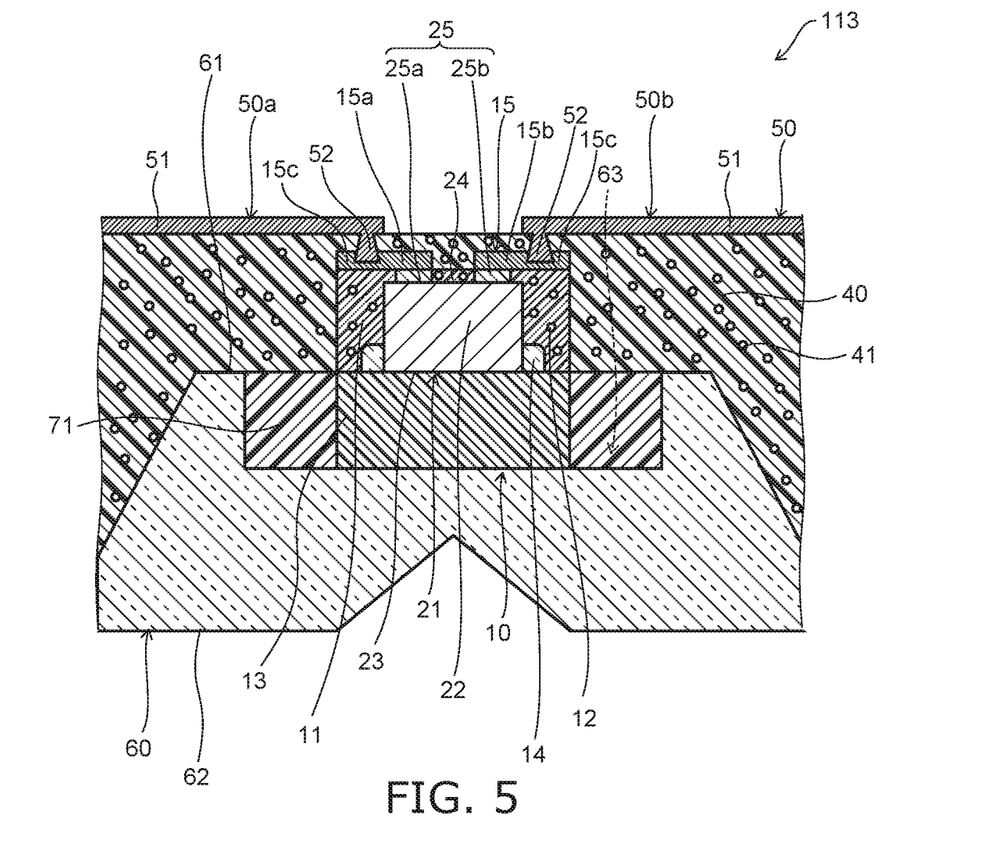

FIGS. 3 to 5 are schematic cross-sectional views showing other examples of light-emitting modules according to the first embodiment. The configurations of the connection portions 52 of the wiring members 50a and 50b of the light-emitting modules 111, 112, and 113 shown in FIGS. 3 to 5 are different from those of the light-emitting module 110 shown in FIG. 1. Other than the connection portions 52, the configurations of the light-emitting modules 111, 112, and 113 are similar to the configuration of the light-emitting module 110.

In the light-emitting module 111 shown in FIG. 3, the connection portions 52 extend through the conductive layers 15a and 15b and reach the resin member 11. Such a structure can increase the contact area and reduce the contact resistance between the connection portions 52 and the conductive layers 15a and 15b. Also, as described below, the tolerance that relates to the depths of the holes filled with the connection portions 52 is increased, and stable manufacturing is easier.

In the light-emitting module 112 shown in FIG. 4, the connection portions 52 contact the upper surfaces of the conductive layers 15a and 15b.

In the light-emitting module 113 shown in FIG. 5, the widths (or the diameters) of the lower portions of the connection portions 52 are greater than the widths (or the diameters) of the upper portions of the connection portions 52. Such a structure of the connection portions 52 can reduce the resistances of the connection portions between the connection portions 52 and the conductive layers 15a and 15b.

Figure 6:
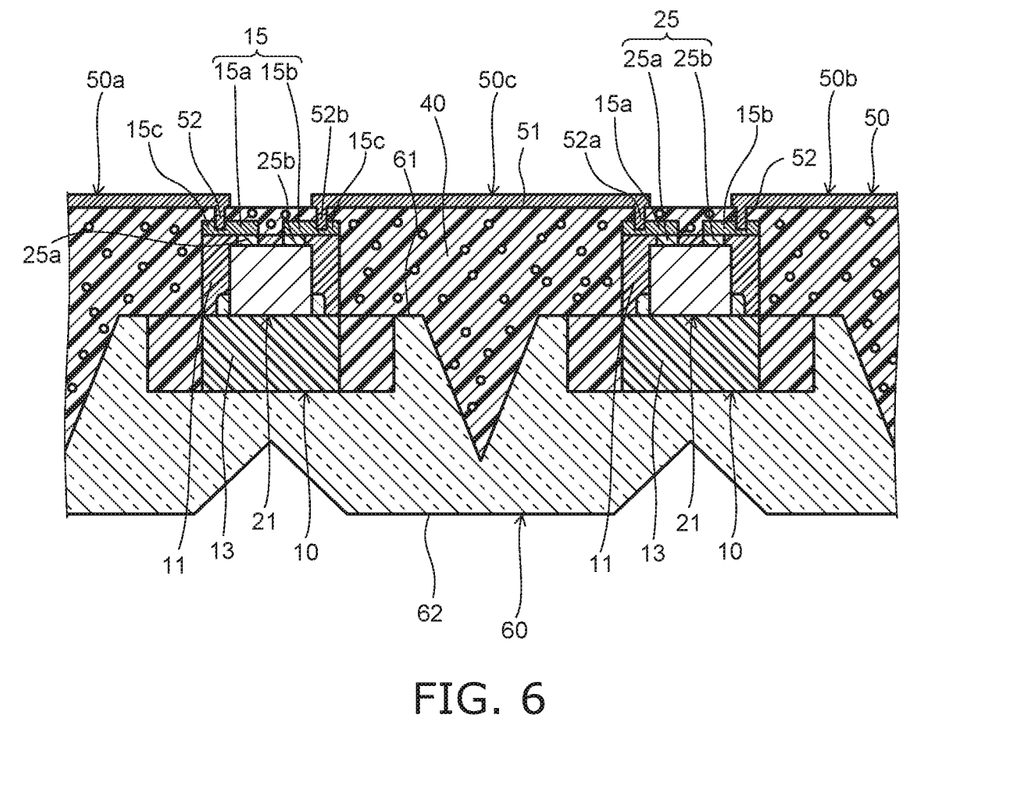

In a light-emitting module that includes multiple light-emitting devices 10 for one optical member 60 as shown in FIG. 6, the electrodes 25b and 25a that have different polarities and are in adjacent light-emitting devices 10 may be electrically connected by a wiring member 50c on the insulating member 40.

The wiring member 50c includes the wiring portion 51 provided at the upper surface of the insulating member 40, and two connection portions 52a and 52b connected to the wiring portion 51. Each of the connection portions 52a and 52b at the two ends of the wiring member 50c extends through the insulating member 40 and is connected to one light-emitting device 10. Specifically, the connection portion 52b, i.e., one connection portion of the wiring member 50c (at the left in FIG. 6), is connected to the conductive layer 15b connected to the electrode 25b of the light-emitting device 10, and the connection portion 52a, i.e., the other connection portion of the wiring member 50c, extends through the insulating member 40 and is connected to the conductive layer 15a connected to the electrode 25a of another light-emitting device 10 (at the right in FIG. 6). The two light-emitting devices 10 can be connected in series by the wiring member 50c.

Figure 7:
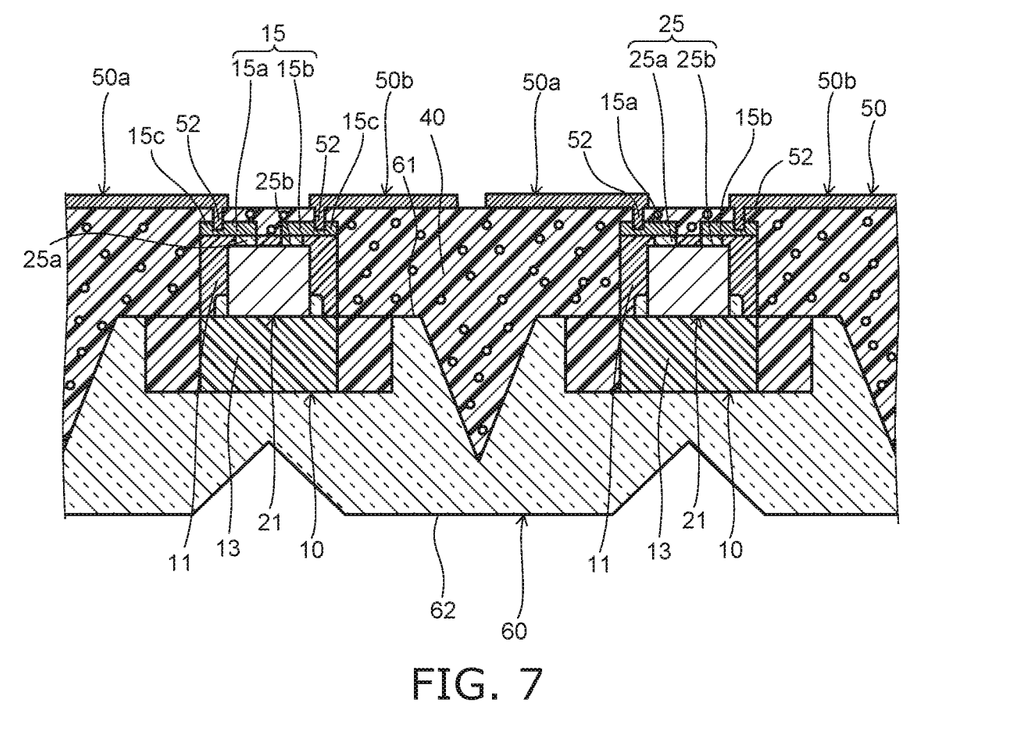

Or, a light-emitting module that includes multiple light-emitting devices 10 for one optical member 60 may have a configuration in which each light-emitting device 10 is connected to two mutually-separated wiring members 50a and 50b as shown in FIG. 7. The wiring member 50b and the wiring member 50a that are disposed on the region between the adjacent light-emitting devices 10 are separated on the insulating member 40.

Second Embodiment

Figure 8:
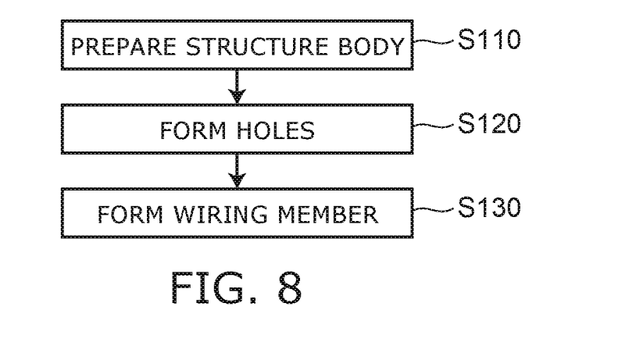
FIG. 8 is a flowchart illustrating a method for manufacturing a light-emitting module according to a second embodiment of the present disclosure.

FIG. 8 is a flowchart illustrating a method for manufacturing a light-emitting module according to a second embodiment.

Figure 9:
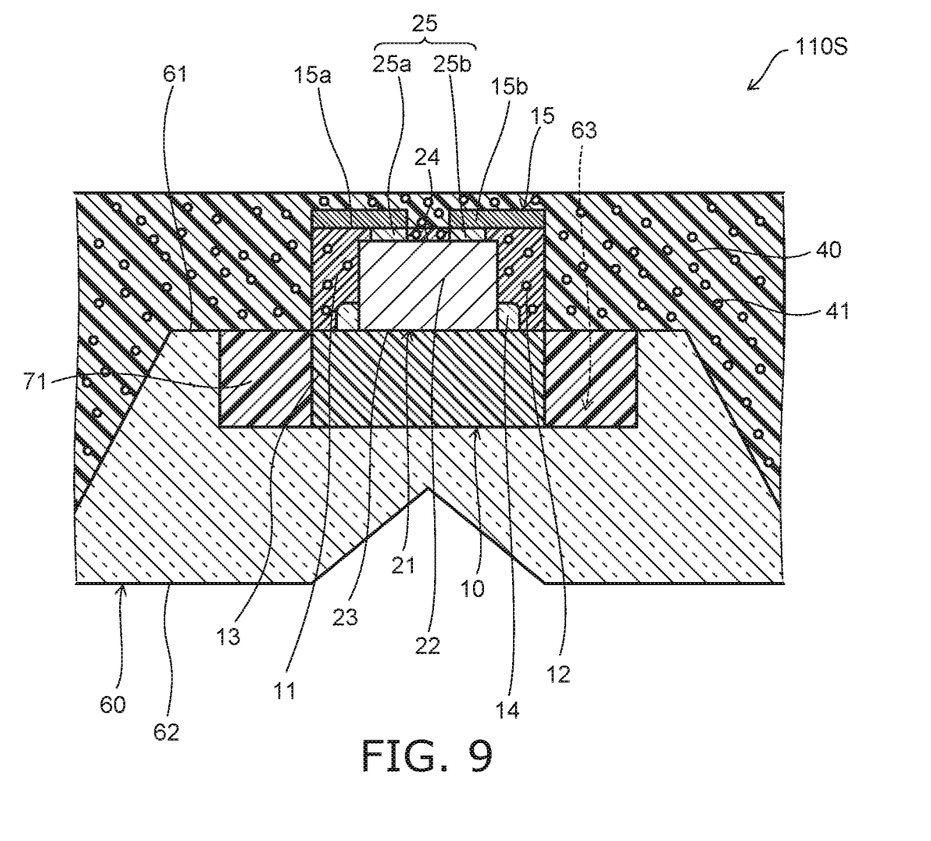
FIG. 9 is a schematic cross-sectional view illustrating the method for manufacturing the light-emitting module according to the second embodiment of the present disclosure.
Figure 10:
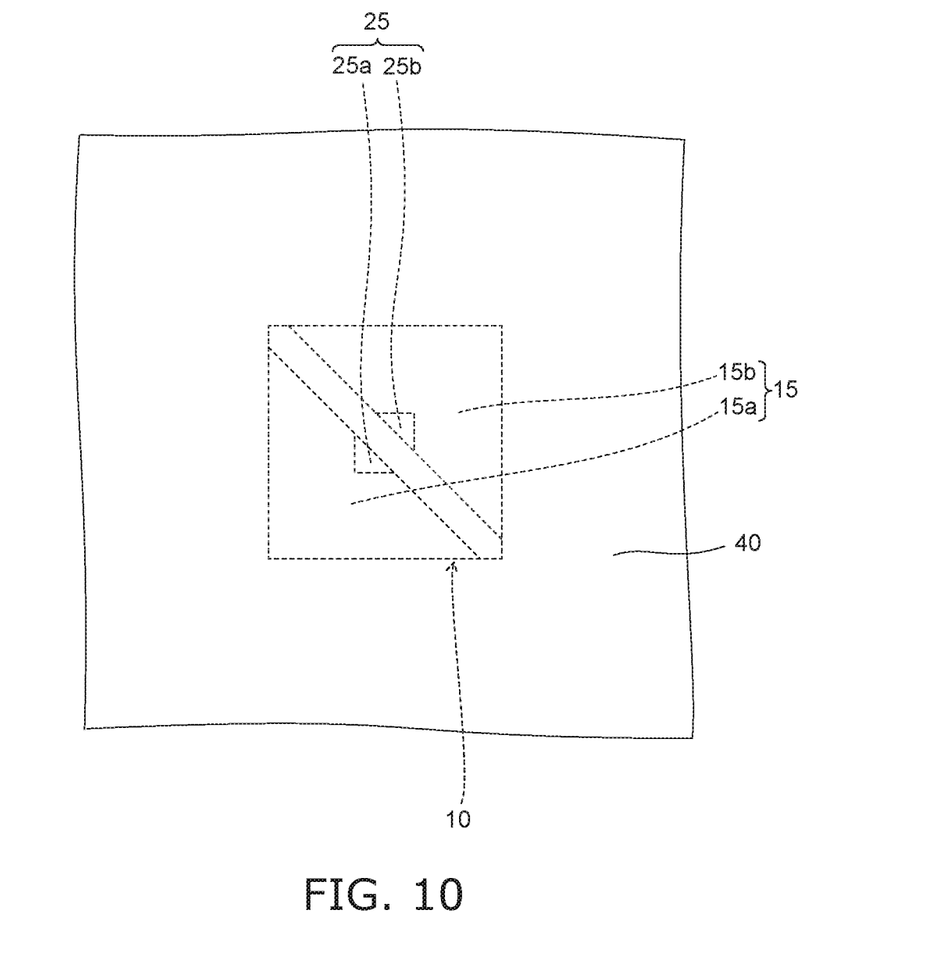
FIG. 10 is a schematic top view of a structure body of FIG. 9 of the present disclosure.

FIG. 9 is a schematic cross-sectional view illustrating the method for manufacturing the light-emitting module according to the second embodiment; FIG. 10 is a schematic top view of the structure body of FIG. 9.

Figure 11:
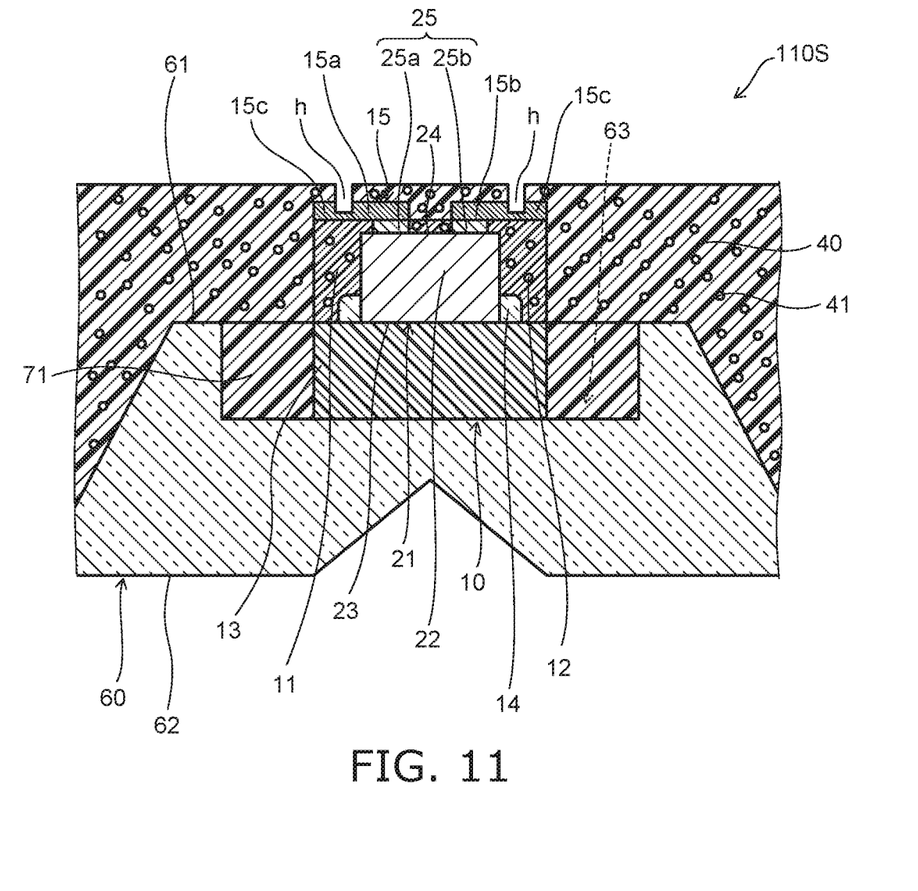
FIG. 11 is a schematic cross-sectional view illustrating the method for manufacturing the light-emitting module according to the second embodiment of the present disclosure.
Figure 12:
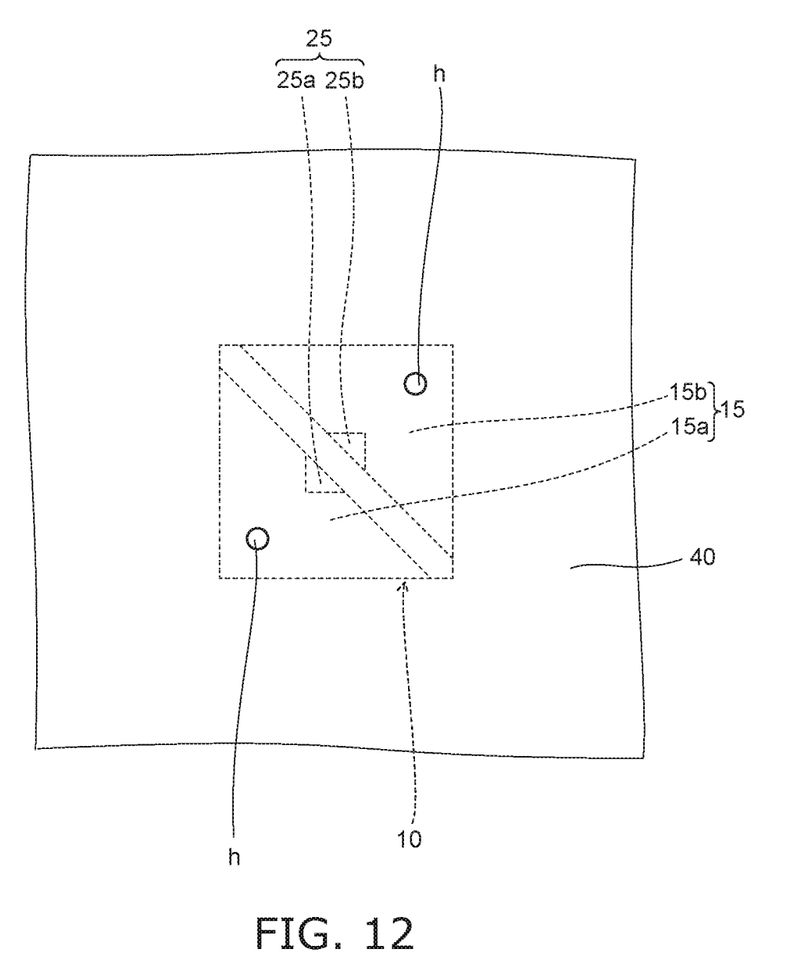
FIG. 12 is a schematic top view of a structure body of FIG. 11.

FIG. 11 is a schematic cross-sectional view illustrating a process continuing from FIG. 9; FIG. 12 is a schematic top view of the structure body of FIG. 11.

As shown in FIG. 8, the method for manufacturing the light-emitting module according to the embodiment includes a process of preparing the structure body 110S shown in FIG. 9 (step S110).

As shown in FIG. 9, the structure body 110S includes the light-emitting device 10, the optical member 60, and the insulating member 40 described above. The light-emitting device 10 includes the light-emitting element 21, the resin member 11, and the conductive layers 15a and 15b.

After bonding the light-emitting device 10 to the first major surface 61 side of the optical member 60, the insulating member 40 is formed on the first major surface 61 to cover the light-emitting device 10. The entire surfaces of the upper surfaces of the conductive layers 15a and 15b are covered with the insulating member 40.

As shown in FIG. 8, the manufacturing method according to the embodiment includes a process of forming holes (step S120) after step S110.

As shown in FIG. 11, holes h are formed in the insulating member 40 on the conductive layers 15a and 15b by irradiating laser light on the insulating member 40. The holes h reach the conductive layers 15a and 15b at regions on the resin member 11.

One, two, or more holes h may reach the conductive layer 15a, and one, two, or more holes h may reach the conductive layer 15b. As shown in FIG. 12, the planar shape of the hole h is, for example, circular, and the diameter of the hole h is, for example, not less than 10 μm and not more than 100 μm.

In the example shown in FIG. 11, the bottoms of the holes h are positioned inside the conductive layers 15a and 15b, and recesses are formed in the upper surfaces of the conductive layers 15a and 15b.

As shown in FIG. 8, the manufacturing method according to the embodiment includes a process of forming a wiring member (step S130) after step S120.

For example, the conductive material is filled into the holes h and formed on the front surface of the insulating member 40 by printing. The wiring members 50a and 50b shown in FIG. 1 are formed thereby.

The holes h may extend through the conductive layers 15a and 15b to reach the resin member 11. In such a case, the structure illustrated in FIG. 3 is obtained. Because the holes h are formed at regions on the resin member 11 covering the side surface of the light-emitting element 21, the holes h do not reach the light-emitting element 21 if the holes h extend through the conductive layers 15a and 15b, and the light-emitting element 21 is not damaged by the laser light.

The bottoms of the holes h may be at the front surfaces of the conductive layers 15a and 15b. In such a case, the structure illustrated in FIG. 4 is obtained.

When irradiating the laser light, there are cases where the absorption of the laser light by the conductive layers 15a and 15b is greater than the absorption of the laser light by the insulating member 40. Thereby, there are cases where the temperature at the conductive layers 15a and 15b becomes greater than the temperature at the insulating member 40. In such a case, the temperature increases more easily proximate to the conductive layers 15a and 15b. In such a case, the diameter of the bottom of the hole h easily becomes greater than the diameter of the upper portion of the hole h. In such a case, the structure illustrated in FIG. 5 is obtained.

When the laser light irradiated in step S120 is, for example, a solid-state laser such as a $YVO_4$ or YAG laser, it is preferable for the wavelength of the laser light to be, for example, not less than 200 nm and not more than 600 nm. In one example, the wavelength of the laser light is about 532 nm. The power of the laser light is, for example, not less than 0.5 W and not more than 10 W. For example, the laser light has a pulse form. The width of one pulse is, for example, not less than 10 ns and not more than 100 ns. In one example, the width of one pulse is 50 ns.

Hereinabove, embodiments of the invention are described with reference to specific examples. However, the invention is not limited to these specific examples.

Combinations of any two or more components of the specific examples within the extent of technical feasibility also are within the scope of the invention to the extent that the spirit of the invention is included.

All light-emitting modules practicable by an appropriate design modification by one skilled in the art based on the light-emitting modules described above as embodiments of the invention are within the scope of the invention to the extent that the spirit of the invention is included.

Various modifications and alterations within the spirit of the invention will be readily apparent to those skilled in the art, and all such modifications and alterations should be seen as being within the scope of the invention.

What is claimed is:

1. A light-emitting module, comprising:
    an optical member including a first major surface, and a second major surface opposite to the first major surface;
    a plurality of light-emitting devices bonded to the first major surface, each of the light-emitting devices including
        a light-emitting element including a major light-emitting surface, an electrode surface opposite to the major light-emitting surface, and an electrode disposed at the electrode surface,
        a resin member covering a side surface of the light-emitting element, and
        a conductive layer disposed continuously on the electrode and on the resin member;
    an insulating member covering the first major surface of the optical member, a side surface of each of the light-emitting devices, and a portion of the conductive layer of each of the light-emitting devices; and
    a wiring member disposed on the insulating member and electrically connected to the conductive layer,
    the electrodes of adjacent light-emitting devices being connected by the wiring member disposed on the insulating member.

2. The light-emitting module according to claim 1, further comprising:
    a transparent member disposed at the major light-emitting surface of the light-emitting element.

3. The light-emitting module according to claim 2, wherein
    the transparent member includes a fluorescer.

4. The light-emitting module according to claim 1, wherein
    the wiring member is connected to the conductive layer in a recess formed in the conductive layer.

5. The light-emitting module according to claim 1, wherein
    the wiring member is connected to the conductive layer at a region on the resin member.

6. The light-emitting module according to claim 5, wherein
    a portion of the wiring member connected to the conductive layer extends through the conductive layer and reaches the resin member.

7. The light-emitting module according to claim 1, wherein
    the wiring member is connected to a portion of the conductive layer provided between the resin member and the insulating member.

8. The light-emitting module according to claim 1, wherein
    the optical member includes a plurality of first recesses, and
    the light-emitting devices are disposed in the first recesses.

9. The light-emitting module according to claim 8, wherein
    the optical member includes a second recess disposed at the first major surface in an area between the adjacent light-emitting devices.

10. The light-emitting module according to claim 9, wherein
    the insulating member is disposed in the second recess.

11. The light-emitting module according to claim 1, wherein
    the optical member includes a second recess disposed at the first major surface in an area between the adjacent light-emitting devices.

12. The light-emitting module according to claim 11, wherein
    the insulating member is disposed in the second recess.

13. A method for manufacturing a light-emitting module, the method comprising:
    preparing a structure body including
        an optical member including a first major surface, and a second major surface opposite to the first major surface,
        a light-emitting device bonded to the first major surface, the light-emitting device including:
            a light-emitting element including a major light-emitting surface, an electrode surface opposite to the major light-emitting surface, and an electrode disposed at the electrode surface;
            a resin member covering a side surface of the light-emitting element; and
            a conductive layer disposed continuously on the electrode and on the resin member, and
        an insulating member covering the first major surface of the optical member, a side surface of the light-emitting device, and the conductive layer;
    forming a hole reaching the conductive layer by irradiating laser light on the insulating member; and
    forming a wiring member in the hole and at an upper surface of the insulating member, the wiring member being connected to the conductive layer.

14. The method according to claim 13, wherein the hole extends through the conductive layer.

15. A light-emitting module, comprising:
an optical member including a first major surface, and a second major surface opposite to the first major surface;
a plurality of light-emitting devices bonded to the first major surface, each of the light-emitting devices including
a light-emitting element including a major light-emitting surface, an electrode surface opposite to the major light-emitting surface, and an electrode disposed at the electrode surface, and
a resin member covering a side surface of the light-emitting element;
an insulating member covering the first major surface of the optical member, and a side surface of each of the light-emitting devices; and
a wiring member disposed on the insulating member and electrically connected to the electrodes of adjacent light-emitting devices.

16. The light-emitting module according to claim 15, wherein
the optical member includes a plurality of first recesses, and
the light-emitting devices are disposed in the first recesses.

17. The light-emitting module according to claim 16, wherein
the optical member includes a second recess disposed at the first major surface in an area between the adjacent light-emitting devices.

18. The light-emitting module according to claim 17, wherein
the insulating member is disposed in the second recess.

19. The light-emitting module according to claim 15, wherein
the optical member includes a second recess disposed at the first major surface in an area between the adjacent light-emitting devices.

20. The light-emitting module according to claim 19, wherein
the insulating member is disposed in the second recess.

* * * * *